(12) United States Patent
Pagani

(10) Patent No.: US 9,413,055 B2
(45) Date of Patent: Aug. 9, 2016

(54) PACKAGED ELECTRONIC DEVICE WITH INTEGRATED ELECTRONIC CIRCUITS HAVING TRANSCEIVING ANTENNAS

(71) Applicant: STMICROELECTRONICS S.R.L., Agrate Brianza (IT)

(72) Inventor: Alberto Pagani, Nova Milanese (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 181 days.

(21) Appl. No.: 14/470,893

(22) Filed: Aug. 27, 2014

(65) Prior Publication Data

US 2014/0368394 A1    Dec. 18, 2014

Related U.S. Application Data

(63) Continuation-in-part of application No. PCT/IB2013/051422, filed on Feb. 21, 2013.

(30) Foreign Application Priority Data

Feb. 27, 2012   (IT) .............................. TO2012A0174

(51) Int. Cl.
*H01Q 1/00* (2006.01)
*H01Q 1/22* (2006.01)
*H01L 23/48* (2006.01)
(Continued)

(52) U.S. Cl.
CPC .............. *H01Q 1/2283* (2013.01); *H01L 21/56* (2013.01); *H01L 23/13* (2013.01); *H01L 23/48* (2013.01); *H01L 23/481* (2013.01); *H01L 23/66* (2013.01); *H01L 25/03* (2013.01); *H01L 25/065* (2013.01); *H01L 25/0652* (2013.01); *H01L 25/0655* (2013.01); *H01L 25/0657* (2013.01); *H01L 25/105* (2013.01); *H01L 2223/6616* (2013.01); *H01L 2223/6677* (2013.01); *H01L 2225/06524* (2013.01); *H01L 2225/06531* (2013.01); *H01L 2225/06562* (2013.01);

(Continued)

(58) Field of Classification Search
CPC ................................................... H01Q 1/2283
USPC ......................................................... 343/787
See application file for complete search history.

(56) References Cited

U.S. PATENT DOCUMENTS

| 7,095,226 B2 | 8/2006 | Wan et al. |
| 2009/0321929 A1 | 12/2009 | Feng et al. |
| 2011/0170266 A1 | 7/2011 | Haensch et al. |

FOREIGN PATENT DOCUMENTS

WO   2010/076187 A2   7/2010

*Primary Examiner* — Graham Smith
(74) *Attorney, Agent, or Firm* — Seed IP Law Group PLLC

(57) ABSTRACT

A base carries a first chip and a second chip oriented differently with respect to the base and packaged in a package. Each chip integrates an antenna and a magnetic via. A magnetic coupling path connects the chips, forming a magnetic circuit that enables transfer of signals and power between the chips even if the magnetic path is interrupted, and is formed by a first stretch coupled between the first magnetic-coupling element of the first chip and the first magnetic-coupling element of the second chip, and a second stretch coupled between the second magnetic-coupling element of the first chip and the second magnetic-coupling element of the second chip. The first stretch has a parallel portion extending parallel to the faces of the base. The first and second stretches have respective transverse portions extending on the main surfaces of the second chip, transverse to the parallel portion.

21 Claims, 8 Drawing Sheets

(51) Int. Cl.
*H01L 25/065* (2006.01)
*H01L 23/13* (2006.01)
*H01L 23/66* (2006.01)
*H01L 25/03* (2006.01)
*H01L 25/10* (2006.01)
*H01L 21/56* (2006.01)

(52) U.S. Cl.
CPC ............ *H01L 2225/1011* (2013.01); *H01L 2225/1047* (2013.01); *H01L 2924/0002* (2013.01)

US 9,413,055 B2

PACKAGED ELECTRONIC DEVICE WITH INTEGRATED ELECTRONIC CIRCUITS HAVING TRANSCEIVING ANTENNAS

BACKGROUND

1. Technical Field

The present disclosure relates to a packaged electronic device comprising integrated electronic circuits having transceiving antennas.

2. Description of the Related Art

As is known, integrated circuits are generally provided in chips of semiconductor material and communicate and interact with the outside world through pads, i.e., portions of conductive material for connection with the outside, such as for example other integrated circuits, external components, conductive supports, and the like.

In detail, each pad may form a termination of a line for conveying electrical signals inside the integrated circuit, or a point for supplying the integrated circuit or other circuits.

Pads of different integrated devices, provided in different chips, may be connected together for example through wires (wire bonding), contact bumps, and/or conductive paths. In all cases, one or more low-impedance resistive paths electrically connect the integrated devices.

In case of a system comprised in a package, the so-called "System in Package" (SiP), i.e., of an electronic device comprising, within a same package, at least two chips and, possibly, passive components, the integrated circuits of the SiP are generally electrically connected through their own pads. Moreover, frequently pads of different integrated circuits are electrically connected through so-called through-silicon vias (TSVs).

However, this solution is not always optimal, since the electrical through vias are subject to important parasitic phenomena that cause their electrical behavior to be non-ideal. In addition, they do not enable sharing with more integrated circuits, and have rather complex manufacturing processes.

In order to overcome in part the described problems, SiPs have been proposed comprising integrated devices provided with a suitable transceiver (also known as "transponder") connected to a transceiving antenna, typically embedded in the integrated circuit and in general of the loop type. These systems enable exchange of power and information in a magnetic/electromagnetic way. In some solutions, SiPs are provided with electromagnetic expansions in order to improve coupling between the transceiving antennas and/or magnetic cores formed inside or outside the packaging structure.

Patent application No. WO2010076187 discloses solutions having magnetic through silicon vias (or magnetic TSVs) that enable establishment of magnetic circuits between at least two devices in face-to-face, face-to-back, back-to-face, and back-to-back configuration.

These solutions provide for the chips to be arranged on top of each other. However, sometimes it is necessary to connect two devices with a different orientation, typically a device with horizontal orientation and a device with vertical orientation.

This is currently obtained by attaching the two chips on a support and connecting them via electrical connections. At times, the horizontal device and the vertical device are contiguous to each other in such a way that a minor lateral surface of the horizontal device is contiguous to at least part of the main vertical surface of the vertical device (see, for example, U.S. Pat. No. 7,095,226).

This solution may be unsuitable in certain situations, for example, in an environment subject to vibrations and/or mechanical or environmental stresses, in view of the possible damage to the conductive path, which may in some case be interrupted, causing malfunctioning of the system. In other cases, cracks may form in the package and allow seeping of foreign substances, with possible contamination and/or corrosion and thus interruption of the electrical connection.

In case of a plurality of devices, the interconnections may be complex, and the manufacturing process is critical and may cause a reduction of the quality of the final system.

BRIEF SUMMARY

One embodiment of the present disclosure is directed to a packaged device that includes a base having a first face and a second face, a first chip of semiconductor material attached to the first face of the base and having main extension parallel to the base, a second chip of semiconductor material carried by the base and having main extension transverse to the base, a first package surrounding the first and second chips and covering the base. Each chip includes a first main surface and a second main surface, an electronic circuit, a transceiving circuit coupled to the electronic circuit, and an antenna and a magnetic coupling via, the antenna extending in proximity of the first main surface of the chip and being coupled to the transceiving circuit of the chip, and the magnetic via extending through the chip, between the antenna of the chip and the second main surface of the chip. The device includes a first magnetic coupling path coupled between a first one of the antenna and magnetic via of the first chip and a first one of the antenna and magnetic via of the second chip and a second magnetic coupling path coupled between a second one of the antenna and magnetic via of the first chip and a second one of the antenna and magnetic via of the second chip, the first magnetic coupling path including a parallel portion extending parallel to the first and second faces of the base, and the first and second magnetic coupling paths including respective transverse portions extending respectively on the main surfaces of the second chip in a direction transverse to the parallel portion.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein.

DETAILED DESCRIPTION

Figure 1:
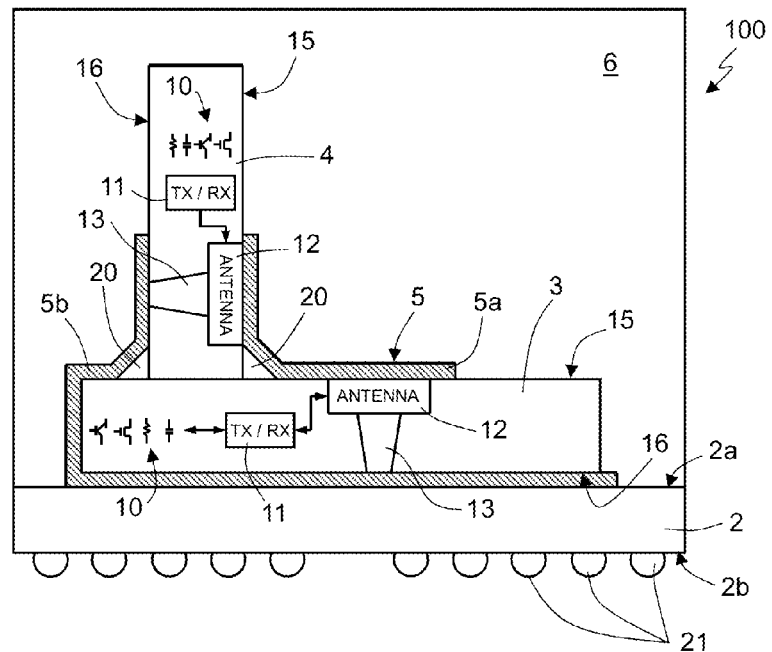
FIGS. 1-3 show different embodiments of the present package.

FIG. 1 shows a packaged device 100 comprising a base 2, a first chip 3, a second chip 4, a magnetic path 5, and a package 6.

The base 2 is formed by a supporting body, typically a printed-circuit board of the type normally used in electronics; it is made of single-layer or multilayer organic material, for example epoxy resin, such as a laminate of BT (bismaleimide triazine) or FR-4 or some other similar material, possibly housing conductive regions, and has a first face 2a and a second face 2b.

The chips 3 and 4 are each formed by one or more layers of semiconductor material (mono- and polycrystalline silicon) and possibly one or more layers of dielectric and/or metal material (not shown) so that each chip forms one or more integrated electronic circuits 10, as represented schematically in FIG. 1 by generic electronic components. The electronic circuits 10 integrated in the chips 3, 4 may be of various types; for example, they may be digital circuits, analog circuits, RF circuits, sensors, actuators, for example including MEMS (Micro-Electro-Mechanical Systems) structures, etc.

The chip 3 may be connected to the base 2, for example using bonding wires (not shown in the figure).

The chips 3, 4 are galvanically insulated from each other and are magnetically connected together. For this purpose, each of the chips 3, 4 integrates in its inside at least one transceiving circuit 11, an antenna 12, and a magnetic via 13.

The transceiving circuits 11 electrically connect each respective integrated electronic circuit 10 with its own antenna 12 for transmitting and/or receiving signals and/or power and typically comprise a transponder or a transceiver and AC/DC and/or DC/AC converter circuits.

Each antenna 12 is formed in the proximity of a first main surface 15 of the respective chip 3, 4, or faces it, and is generally implemented as a loop antenna (with single loop or multiple loops), even though also other types of antennas may be used jointly, such as for example Hertzian dipoles, or interfaces of a capacitive type.

Each magnetic via 13 extends within the respective chip 3, 4, underneath the antenna 12 (with respect to the first main surface 15) or within the antenna 12 (as described, for example, in WO 2010/076187) as far as a second main surface 16 opposite to the first main surface 15. The magnetic vias 13 are electrically decoupled from the respective antennas 12. Each magnetic via 13 has the shape, for example, of a truncated pyramid or a truncated cone set upside down, as described in the aforementioned patent application WO 2010/076187.

One of the two chips, here the first chip 3, is arranged in a horizontal position with respect to the base 2, fixed to the first face 2a thereof, while the other chip, here the second chip 4, is arranged vertically. In the embodiment of FIG. 1, the second chip 4 is mounted on top of the first chip 3 and is mechanically fixed thereto for example by a glue or resin region 20.

The magnetic path 5 is formed by one or more stretches configured to form a magnetic circuit including the magnetic vias 13 of the chip 3, 4. The magnetic path 5 is of magnetic material, e.g., ferrite such as NiZnO, MnZnO, or soft magnetic material, such as CoZrTa, CoZrO, FeHfN(O) and the like.

In particular, in FIG. 1, the magnetic path 5 comprises a first stretch 5a extending on the first main surfaces 15 of the chips 3, 5, between the corresponding antennas 12, and a second stretch 5b extending on the second main surfaces 16 of the chips 3, 4, between the corresponding magnetic vias 13 and in part in contact with the first face 2a of the base 2.

Of course, one or both of the chips 3, 4 may be turned upside down, with the first stretch 5a extending between an antenna 12 and a magnetic via 13 or between the two magnetic vias 13 and the second stretch consequently extending between a magnetic via 13 and an antenna 12 or between the two antennas 12.

Here, the package 6 completely envelops and embeds the chips 3, 4. Bumps 21 are formed on the rear of the base 2 (on its second face 2b) for connection with the outside.

Operatively, the chips 3, 4 communicate with each other by virtue of the coupling existing between the corresponding antennas 12 and may be of a magnetic or electromagnetic type, as described in the aforementioned patent application WO 2010/076187. The magnetic circuit formed by the magnetic vias 13 and by the magnetic path 5 enables a magnetic coupling between the antennas 12 of the two chips 3, 4 and thus efficient transmission of signals and power between them.

Thanks to the magnetic coupling between the antennas 12, it is not necessary for the magnetic circuit to be continuous, but gaps may exist, that is the magnetic or soft magnetic material may be missing in one or more short portions of the magnetic circuit, without implying any malfunctioning of the system. In this way, should small interruptions of the magnetic paths 5 arise, as a result of mechanical stresses and/or stresses of some other nature (including ageing), the chips 3, 4 are nonetheless able to communicate with each other.

Preferably, the magnetic circuit has a closed shape to prevent demagnetization of the magnetic material, which reduces the performance thereof.

During manufacture, the part of the second stretch 5b arranged between the base 2 and the first chip 3 may be provided prior to attaching of the first chip 3, laying the magnetic material for example via a chemical or electrolytic or electroless process or aerosol printing; after attaching the chip 3, 4, the rest of the magnetic path 5 is provided in a similar way. Alternatively, at least some stretches of the path 5 may be provided directly on the chips 3, 4, via post-processing operations, so that, after assembly, the various stretches are in direct contact or in proximity of each other so as to form the stretches 5a and 5b.

Figure 2:
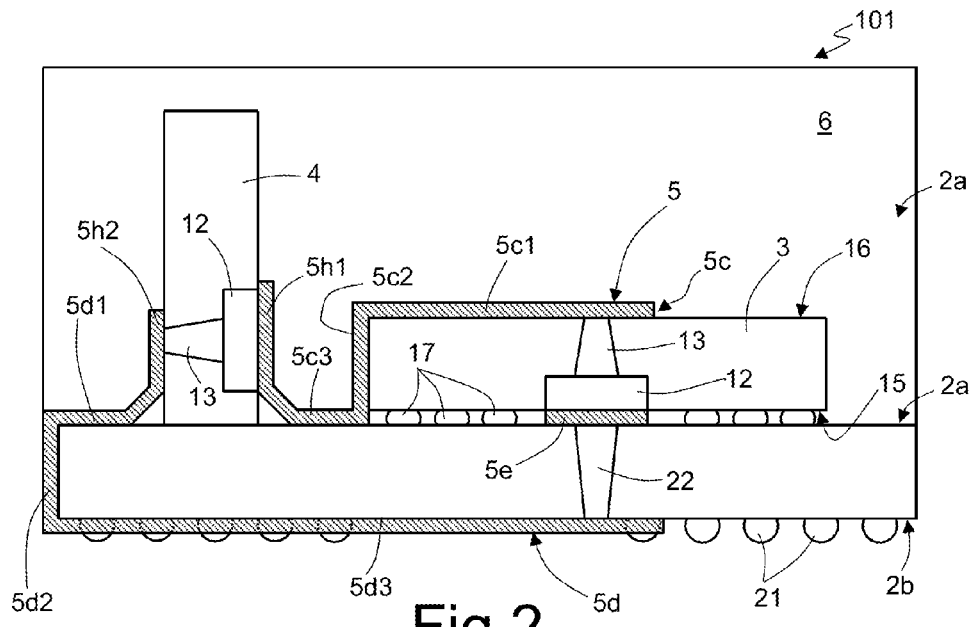

The embodiment of FIG. 2 shows a packaged device 101 in which the second chip 4 extends above the base 2 of the first chip 3 and is fixed to the first face 2a of the base 2.

Here, the first chip 3 is connected to the base 2 through bumps 17 formed on its second main surface 16; the first stretch 5c of the magnetic path 5 comprises a first portion 5c1 extending above the base 2, a second portion 5c2 extending alongside the first chip 3, and a third portion 5c3 extending above the base 2; and the second stretch 5d of the magnetic path 5 extends in part underneath the base 2 (on its second face 2b, at a distance from the chips 3, 4), alongside the bumps 21. Part of the second stretch 5d may moreover extend alongside the base 2 (as shown on the left in the drawing) or the second stretch 5d may be connected to the first face 2a of the base 2 by a magnetic via 22 passing through the base 2. In the example shown, the magnetic via 22 in the base 2 extends substantially aligned to the magnetic via 13 in the first chip 3, and a magnetic portion 5e extends between the base 2 and the second chip 3 to improve coupling. Alternatively, the magnetic portion 5e may be absent. Other solutions are possible, including forming two magnetic vias 22 in the base 2 for connecting the stretches of magnetic path formed on the two faces 2a and 2b of the base 2 (similar to what is shown on the right in FIG. 2), thus replacing the stretch 5d2, or forming a single second stretch 5d extending laterally around the base 2 and at the bottom to form the magnetic circuit comprising the magnetic vias 13 of the chips 3, 4 (similar to what is shown on the left in FIG. 2), or providing a further antenna in the base 2, coupled to the magnetic via 22 so that it may communicate with the outside and/or supply power to the packaged device 101 via the magnetic circuit.

Moreover, the first and second stretches 5c, 5d have vertical portions 5h1, 5h2 extending along the surfaces 15, 16 of the second chip 4.

Figure 3:
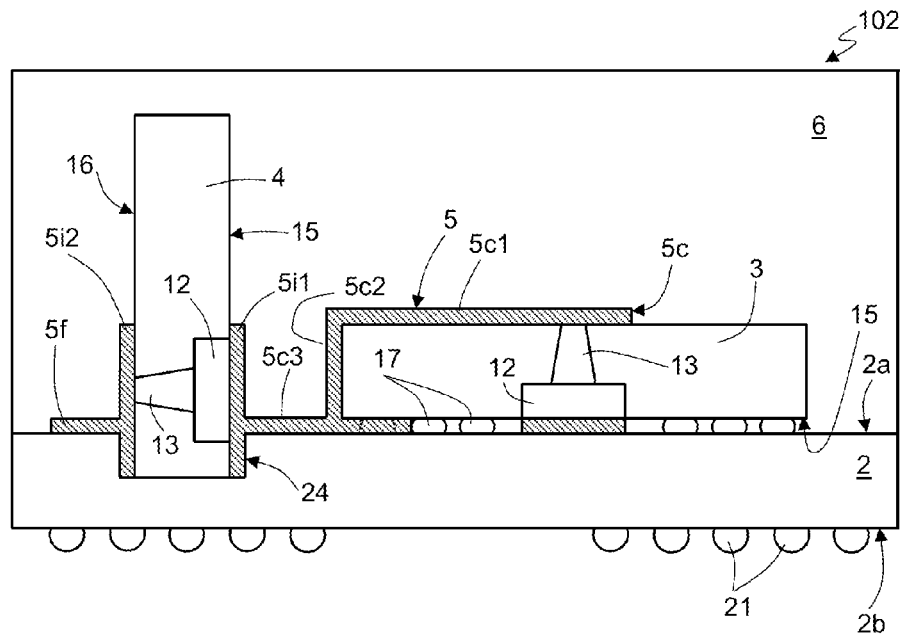
Figure 4:
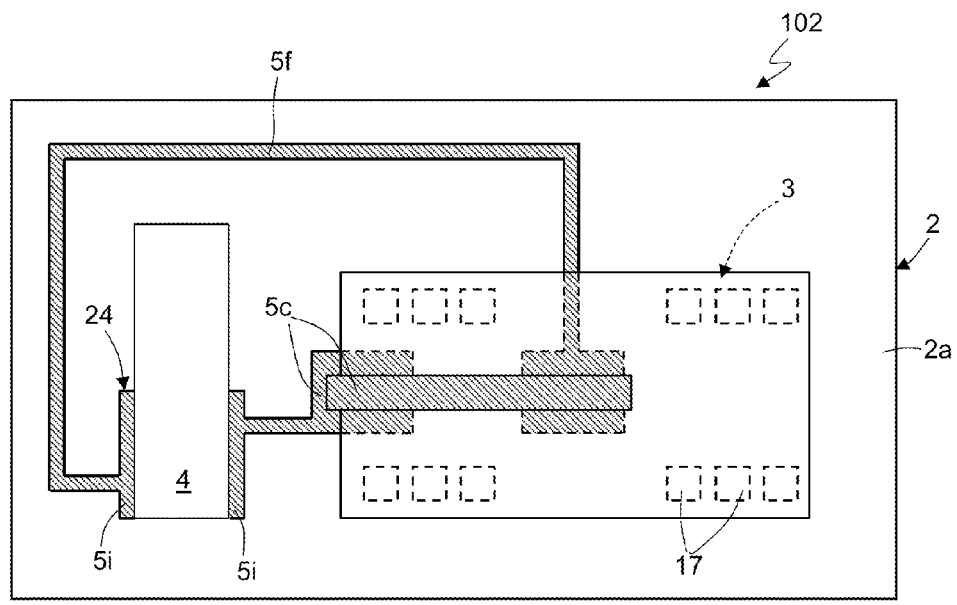
FIG. 4 shows the layout of the package of FIG. 3.

In the packaged device 102 of FIGS. 3 and 4, the first chip 3 is still connected to the base 2 through bumps 17 formed on its second main surface 15, and the second chip 4 is attached directly to the base 2, but the second stretch comprises, in addition to vertical portions 5i1, 5i2 along the surfaces of the second chip 4, also a planar portion 5f (see in particular FIG. 4) entirely formed on the first face 2a of the base 2, with parts extending along the chips 3, 4, in the top plan view of FIG. 4.

Moreover, in FIG. 3, the base 2 has a recess 24 accommodating the second chip 4 so as to simplify and improve mechanical fixing thereof.

In addition, the two vertical portions 5i1, 5i2 of the path 5 extend within the recess 24 so as to form a sort of magnetic socket.

Also in this case, part of the magnetic path 5 may be provided prior to fixing the first chip 3 (portions 5c1, 5c3 5i1, 5i2 and 5f, FIG. 4) and part after fixing the second chip 4, for example by forming, by aerosol jet printing, a magnetic material strip on the side of the first chip 3 (portion 5c2). Alternatively, part of the magnetic path 5 (portions 5c1, 5i1, 5i3) may be formed directly on the chips 3, 4, for example during the manufacture of the wafers from which the chips 3, 4 have been diced or via a post-processing of the wafer or directly on the chips 3, 4.

Figure 5:
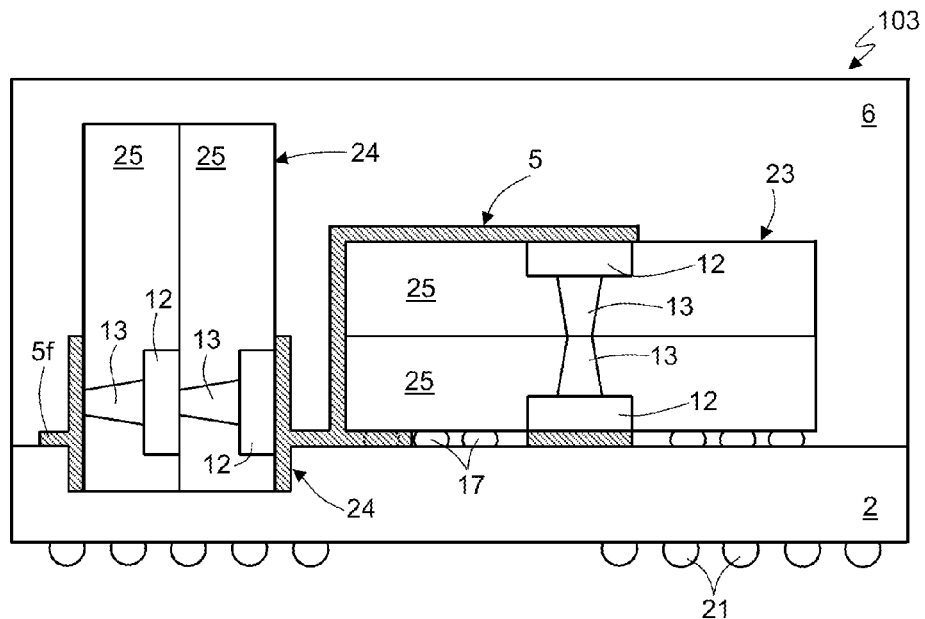
FIGS. 5-11 show further embodiments of the present package.

In the packaged device 103 of FIG. 5, the individual chips 3, 4, are replaced by stacks 23 of chips 25, mutually stacked in a horizontal direction and in a vertical direction and forming a magnetic circuit together with the path 5.

One of the chips 3, 4 may be comprised only in part within the package 6.

Figure 6:
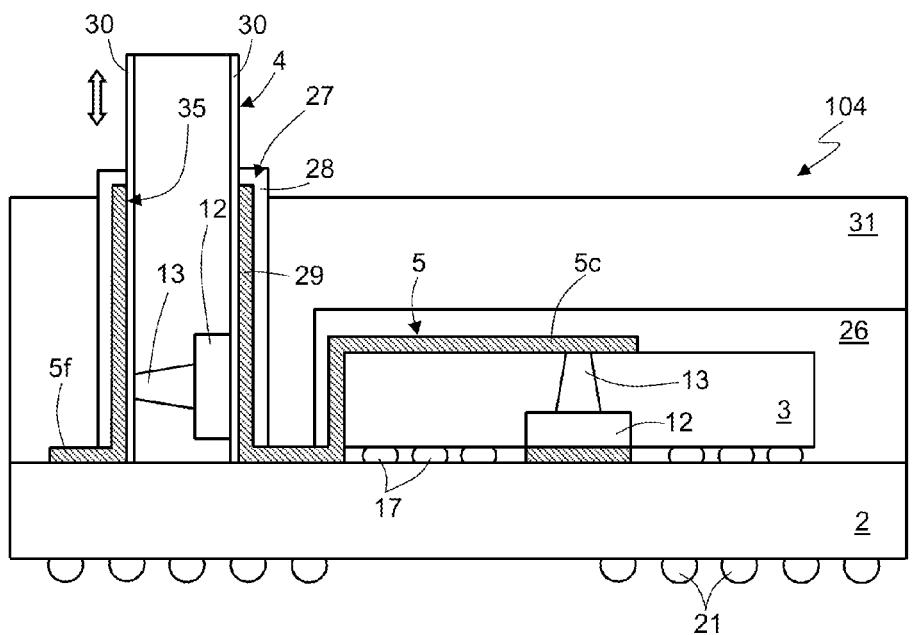

For example, in the packaged device 104 of FIG. 6 the first chip 3 is enclosed in an own package or pre-package 26, accommodating part of the first stretch 5c of the path 5. The first chip 3, thus packaged, is fixed to the base 2 having a magnetic socket 27 comprising a supporting portion 28 of insulating material, for example a ceramic or plastic material on the internal walls of which portions 29 of the magnetic path 5 are formed. The supporting portion 28 may be formed by just two walls, visible in FIG. 6, or by four walls perpendicular two by two. The magnetic socket 27 defines inside it a cavity 35 with a parallelepiped shape, in which the second chip 4 is inserted. The second chip 4 may be coated with magnetic material 30 on its two main surfaces 15, 16.

The internal walls of the magnetic socket 27 may be coated completely by magnetic material or magnetic material, or regions or portions of magnetic or soft magnetic material may be arranged on these walls, along each other and connected or not together by magnetic paths. Possibly the cavity 35 may be coated by a thin insulating layer (not shown in the figure) that protects the magnetic or soft magnetic material. A second package 31 (for example, of a material similar to the package 26, such as, for example, a resin) completely surrounds the first chip 3 and the corresponding package 26 and laterally surrounds the magnetic socket 27.

The magnetic socket 27 may be fixed to the substrate 2 for example via a resin or a glue (not shown) and may present magnetic terminations (which are not shown either) for forming the magnetic circuit, limiting to the minimum the presence of gaps.

Advantageously, the magnetic socket 27 may have engagement structures of a mechanical type (not shown, for example such as springs, slotted joints, pins, hooks, etc.), for blocking in position the second chip 4, enabling, however, insertion and extraction thereof.

Thereby, the second chip 4 may be inserted and removed, for example for its replacement, if and when failures arise in the second chip 4 during testing or during operation. In addition, this solution enables use of the same layout for different final devices, all using a same first chip 3 and a different chip 4 so as to modify the characteristics of the final device.

This enables a considerable saving, exploiting economies of scale. In fact, in the first case (replacement of a failed chip), the replacement of a single element (second chip 4) enables considerable reduction of the costs due to failure because the other components are not to be replaced and thus do not affect the costs. In fact, the presence of the magnetic path 5 allows power and/or signal to be transmitted between the first and the second chips 3, 4, which consequently does not have to be connected directly via electrical conductors, the continuity whereof is essential for operation of the final device and could not be restored in the case of malfunctioning after packaging of the final system.

Obviously, the solution of FIG. 6 may be modified to have a replaceable first chip 3, as an alternative or in addition to the second chip 4, by providing a suitably designed socket, similar to the magnetic socket 27.

In addition, even though in FIG. 6 the magnetic socket 27 projects from the package 31, it may be embedded completely therein, or terminate at the top flush.

Furthermore, even though in FIG. 6 the chip 4 and the corresponding sockets 27 are arranged vertically with respect to the base 2, it is possible to arranged (not shown) the socket and the chip 4 in an oblique way with respect to the base 2, forming an appropriate inclination angle.

In addition, the socket 27 may have more cavities so as to house different chips.

Figure 7:
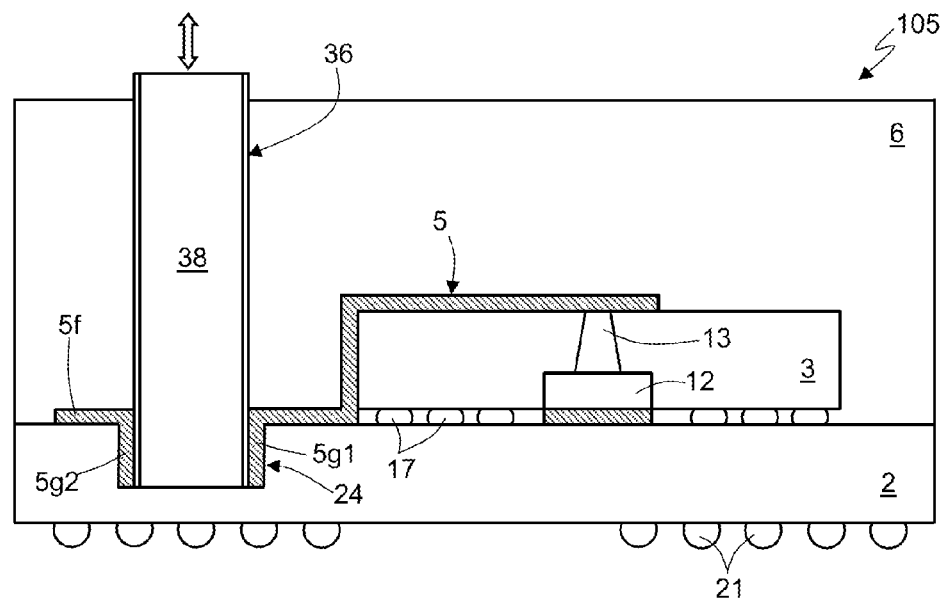

In the packaged device 105 of FIG. 7, the magnetic socket 27 is formed by a recess 24 in the base 2 and a cavity 36 in the package 6. The recess 24 has also here walls coated with magnetic or soft magnetic material 5i1, 5i2, similarly to FIG. 3.

In FIG. 7, the first chip 3 is not surrounded by an own package or prepackage, but the package 6 defines the general package of the final device. However, an embodiment may have the magnetic socket 27 formed by the recess 24, the cavity 36, and the stretches 5g1, 5g2, and two packages, one suitably designed for the first chip 3 and a general one, similarly to FIG. 6.

In addition, the solutions shown in FIGS. 6 and 7 may be used for housing stacks of chips, similarly to the stacks 23 of FIG. 5, wherein at least one of the two stacks is inserted in a magnetic socket 27 enabling a simple insertion and possibly removal thereof. Moreover, a single package may be provided, as in FIG. 1, or a double package, as in FIG. 6.

The solution of FIG. 7 houses, in the cavity 36, a packaged chip 38, configured to form part of the magnetic circuit including the path 5. To this end, the packaged chip 38 may be provided with portions of a path of magnetic or soft magnetic material and/or of magnetic vias similar to the magnetic via 22 of FIG. 2.

The packaged chip 38 may have any shape, for example cylindrical, parallelepiped with polygonal base, pyramidal or frusto-pyramidal, conical or frusto-conical, or any other three-dimensional shape, and consequently the socket 27 may be provided with a cavity 36 having a suitable shape.

Alternatively, in FIG. 7, the cavity 36 may house a second chip 3, similar to the chip of FIG. 6, not packaged.

Figure 8:
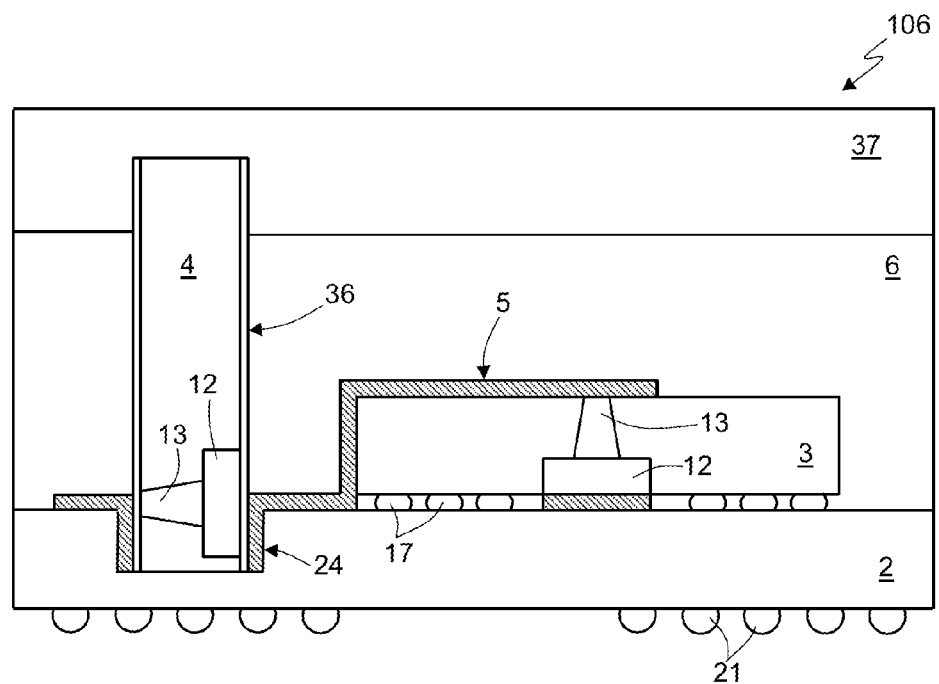

In the packaged device 106 of FIG. 8, the second chip 4 is inserted in a magnetic socket provided in a recess 24 of the base 2, similarly to FIG. 7, and a packaging body 37 is formed on top of the package 6, after insertion of the second chip 4, for example via further packaging material.

Figure 9:
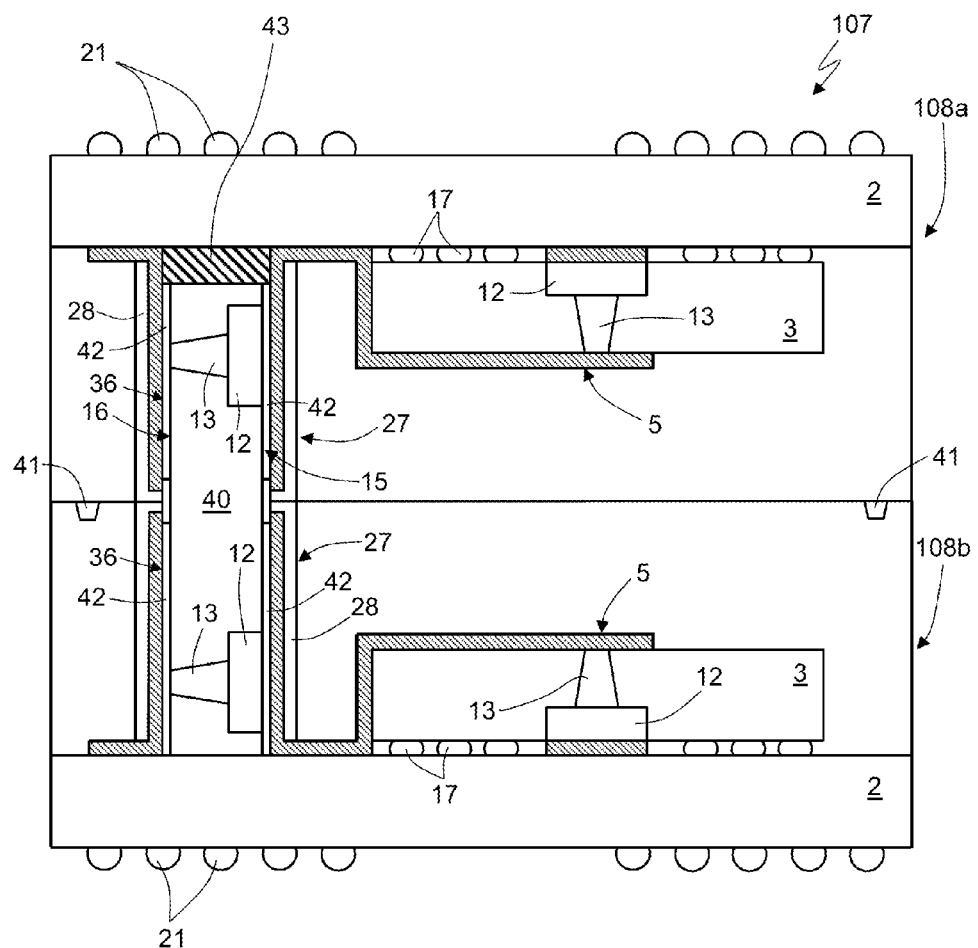

FIG. 9 shows a packaged device 107 wherein two electronic devices 108a, 108b, similar to the packaged device 105 of FIG. 7, are arranged on top of each other, one turned upside down with respect to the other so as to have two bases 2, two first chips 3, two magnetic paths 5, and two cavities 36. The two cavities 36 are arranged aligned to each other and house a respective portion of a second chip 40. The second chip 40, in turn, has two antennas 12 and two magnetic vias 13, each antenna 12 and corresponding magnetic via 13 being connected to a respective magnetic path 5 to form two magnetic circuits, including a respective first chip 3.

In the embodiment shown in FIG. 9, each electronic device 108a, 108b has a respective magnetic socket 27, of the type shown in FIG. 6, housing a respective portion of the second chip 40, and mechanical keys 41 are formed in or made of the packaging material or some other material, for example metal, and are arranged between the two packages 6 for simplifying alignment and assembly of the electronic devices 108a, 108b. An adhesive material 43 may be provided for blocking the second chip 40 in position.

Magnetic regions 42 are formed on the main surfaces 15 and 16 of the second chip 40. In particular, in the embodiment shown in FIG. 9, four magnetic regions 42 are configured so that the two magnetic circuits formed in the electronic devices 108a and 108b are insulated from each other. Alternatively, only two magnetic regions 42 may be provided, one on the first main surface 15 and one on the second main surface 16 so that the two magnetic circuits are coupled together.

When only two magnetic regions 42 are provided, the second chip 40 may have a single antenna 12 and a corresponding magnetic via 13.

During assembly, the second chip 40 is inserted in one of the two magnetic sockets 27, before stacking of the electronic devices 108a, 108b, which may be glued to each other.

Alternatively, if they are not glued, the second chip 40 may be replaced if so desired, with the possibility of dismantling and re-assembling the system.

Figure 10:
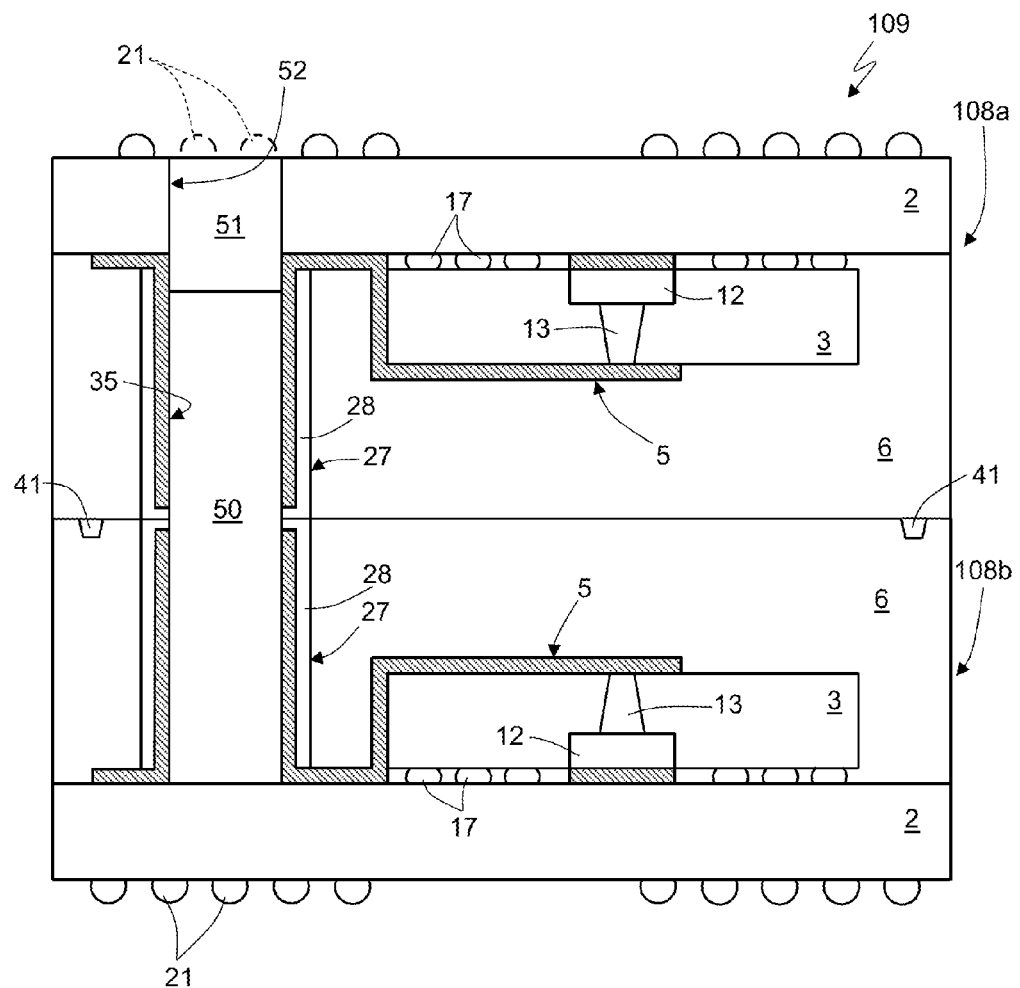

FIG. 10 shows an embodiment of a packaged device 109 wherein, instead of a single second chip 40, the two cavities 36 house a packaged chip 50. In addition, here, the base 2 of the electronic device 108b has a hole 52, as a prolongation of the cavity 35 so as to enable insertion of the packaged chip 50 after mutual fixing of the electronic devices 108a and 108b. In this case, sealing material 51 may be provided in the cavity 35 and in the hole 52 so as to block and seal the packaged chip 50.

Also in this case, if the sealing material 51 is missing or removable, it is possible to replace the packaged chip 50, even after mutual fixing of the electronic devices 108a and 108b.

The sealing material 51 may, in fact, be also a plug so that it may seal the system and be removed in case of replacement of the packaged chip 50.

The packaged chip 50 may present at the top appropriate mechanical regions such as, for example, cavities, slotted joints, hooks, etc., which may facilitate its extraction, for example, via a tool such as grippers, or, in addition, regions may be provided that are magnetized to enable extraction of the packaged chip 50 using a magnetized tool.

In FIG. 10, the packaged chip 50 has four magnetic regions, designated by 42 as in FIG. 9, for coupling to the magnetic circuits. Alternatively, only two magnetic regions may be provided; moreover, the packaged chip 50 may be inserted in the magnetic sockets 27 prior to fixing the electronic devices 108a, 108b, similarly to the second chip 40 of FIG. 9.

Figure 11:
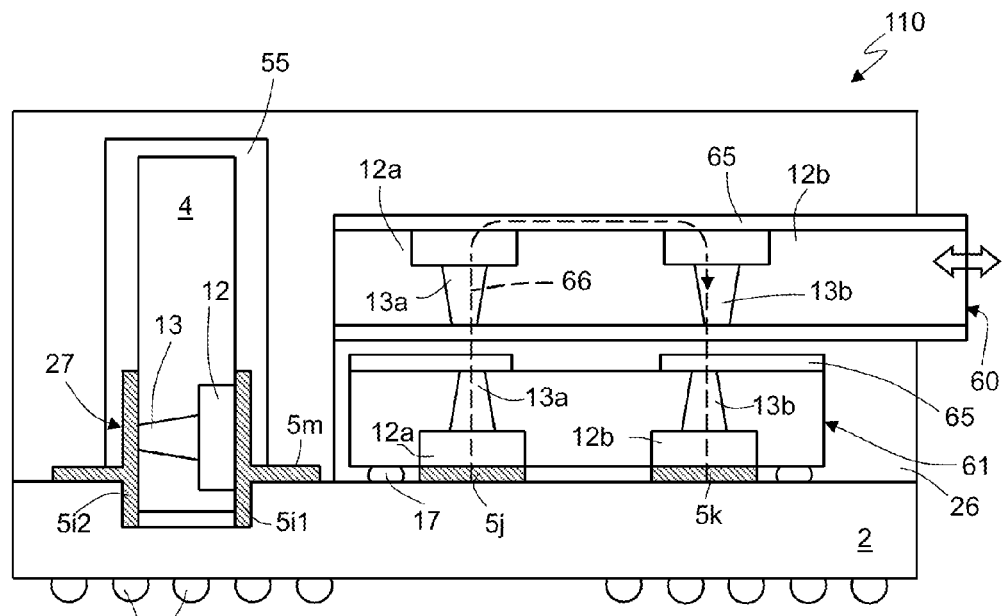
Figure 12:
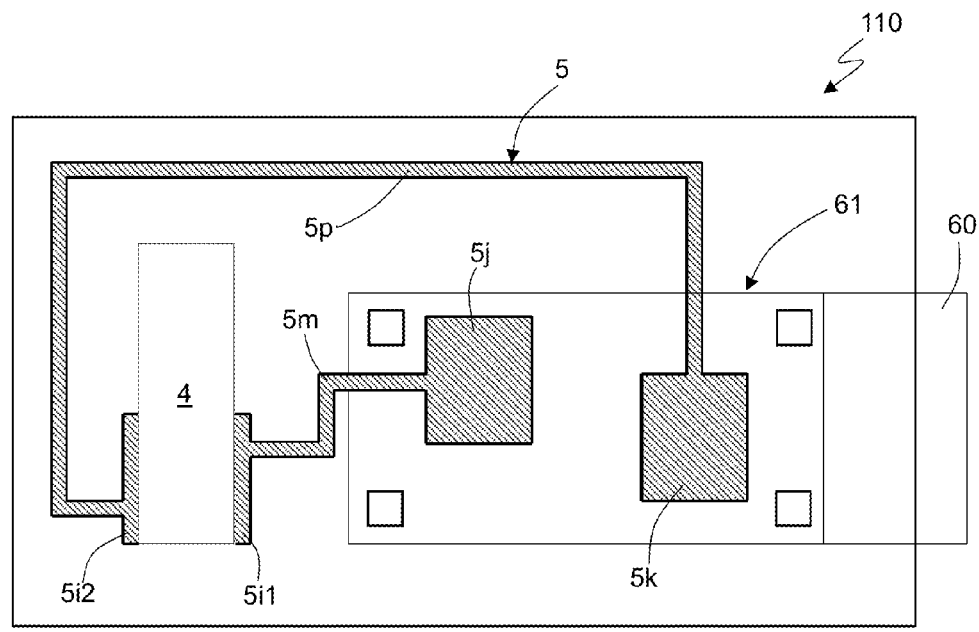
FIG. 12 shows the layout of the package of FIG. 11.

FIGS. 11 and 12 show an embodiment of a device 110 wherein a third chip 60 extends on top of a first chip 61, stacked thereon, and may be extracted therefrom.

In the shown example, the first and second chips 61, 4 are packaged in an own package 26, 55, similar to the first chip 3 of FIG. 6.

In addition, the first chip 61 and the third chip 60 each have a first antenna 12a, and a second antenna 12b, with corresponding first and second internal magnetic vias 13a, 13b, which are arranged on top of each other and are positioned so that the first antennas 12a and corresponding first magnetic vias 13a of the first and third chips 61, 60 are arranged on top of each other and the second antennas 12b and corresponding second magnetic vias 13b are arranged on top of each other so as to be coupled to each other.

The magnetic path 5 is here practically only planar, being supported completely by the base 2, and comprises a first and a second regions 5j, 5k underneath the first chip 60, substantially aligned to the first antennas 12a and, respectively, the second antennas 12b; the vertical portions 5i1, 5i2; a first stretch 5m joining the vertical region 5i1 to the first region 5j; and a second stretch 5p joining the vertical region 5i2 to the second region 5k.

Magnetic regions 65 may be provided on top of the first and third chips 61, 60 so that the magnetic circuit here comprises a horizontal portion, formed substantially by the path 5, and a vertical portion 66, including the antennas 12a, 12b, the magnetic vias 13a, 13b and the magnetic regions 65 and is represented in a dashed line in FIG. 11.

The magnetic regions 65 advantageously reduce the criticality of the alignment between the vertical portions of the magnetic circuit of the first and third chips 61, 60.

As an alternative or in addition to what is shown in FIG. 11, a fourth chip (not shown) could be stacked on the second chip 4 and provide a portion of magnetic circuit having a development similar to that of the vertical portion 66.

In a further embodiment, the third chip 60 could be in common with a further device, which is altogether similar to and arranged alongside the device 110 of FIG. 11, with possible mechanical keys similar to those shown in FIG. 9 but arranged on the lateral surface of the device 110.

It is thus possible to assemble various devices arranged horizontally and vertically with respect to each other, which share at least one chip, which may be arranged in a horizontal or vertical or transverse or oblique position.

Figure 13:
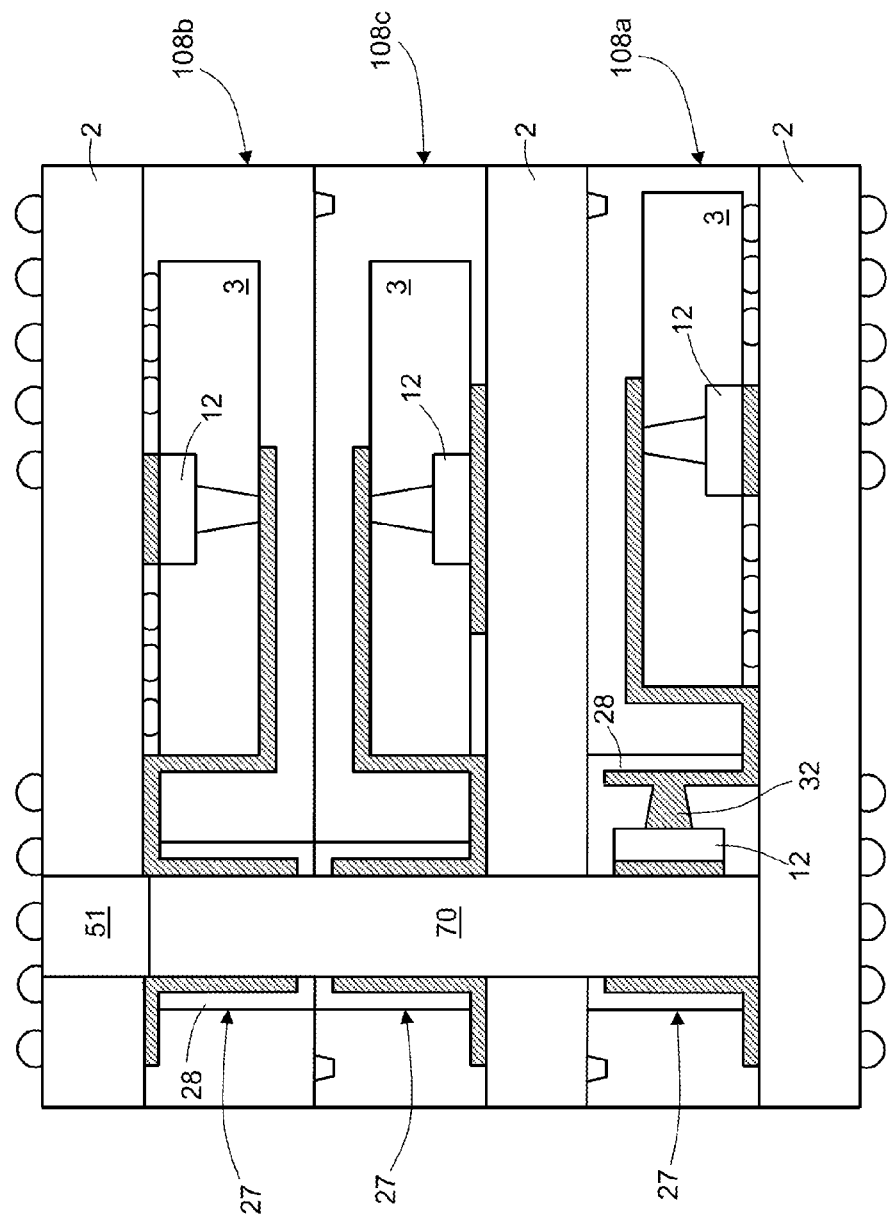
FIG. 13 shows yet a further embodiment of the present package.

FIG. 13 shows an embodiment including an intermediate device 108c comprised between the electronic devices 108a and 108b of FIG. 9. The intermediate device 108c may also lack electrical interconnections, be supplied, and exchange signals via magnetic or electromagnetic field through the magnetic socket 27. In this case, the device 70, which passes through the three electronic devices 108a-108c, is similar to the second chip 40 of FIG. 9 or to the packaged chip 50 of FIG. 10.

The device 70 may comprise at least one antenna 12 and at least one magnetic via 13 for magnetic coupling with the respective paths 5 to form magnetic circuits that in turn may be magnetically coupled or not to each other similarly to what described with reference to FIGS. 9 and 10.

In the socket 27 for the electronic device 108a a further antenna 12 is arranged in the supporting portion 28 so as to be coupled with the magnetic material of the socket 27 and with a possible magnetic via 32. The further antenna 12 may be provided, for example, in a printed-circuit board present in the socket 27 and may have electrical terminals for enabling its connection to other circuits.

The packaged device described above has numerous advantages.

The presence of a magnetic path on top of the base enables exchange of signals and power between two chips, one whereof is parallel to the base and the other transverse, in particular perpendicular, without electrical conductive paths. Thereby, the finished device is much more robust to stresses of a mechanical and/or electrical type or to ageing, since its operation no longer depends upon the electrical continuity of the connections.

The total, or even partial, absence, of electrical conductors enables a simple connection also when one of the two chips is enclosed in an own package.

Provision of a magnetic socket moreover enables insertion and extraction of one of the chips, packaged or not, and thus assembly at any moment (also at the level of the end user) of the device and/or use of the same base and a same chip (for example, the first chip) with different components (for example, the second chip) to obtain finished devices with different functions. The electronic device is thus extremely flexible and affords economies of scale, reducing the costs.

In addition, the magnetic socket enables replacement of chips (packaged or not) in the event of failure, with considerable economic advantages.

The use of magnetic circuits enables a non-complex and reliable assembly.

Finally, it is clear that modifications and variations may be made to the packaged device described and illustrated herein, without thereby departing from the scope of the present disclosure.

In the embodiments of FIGS. 1-10, the first chip 3 may have two antennas 12 and a top magnetic region, similar to the third chip 60 of FIG. 11 so that the magnetic path 5 is completely planar, as shown in FIG. 12.

Furthermore, some implementation aspects may be shared by different embodiments. Consequently, in all the embodiments, the chips 3, 4, 60, 61 may be packaged or not; the single package at a chip level 3, 4, 61 may be provided prior to fixing the chip on the base 2 (as shown in FIG. 7) or after (as in FIG. 6 for the first chip 3 and in FIG. 11, for the chips 4, 61). In all the embodiments of FIGS. 2-12, the magnetic socket 27 may be formed by a suitably designed supporting structure, as, for example, in FIG. 6, or exploiting a recess as in FIG. 3, possibly also providing projections in the base 2, not shown. The individual chips 3, 4 may be replaced by stacks of chips.

Moreover, in the embodiment of FIG. 1, the second stretch 5b may be formed as the second stretch 5d of FIG. 2, and thus extend in part underneath the base 2. In the embodiments of FIGS. 3-13, the planar portions 5f, 5p may be replaced by the portion 5d3 on the rear of the base 2, with lateral joining portions 5d2 and/or magnetic vias 22, coupled to possible further antennas provided in the base 2. The various embodiments described above can be combined to provide further embodiments. Aspects of the embodiments can be modified, if necessary to employ concepts of the various patents, application and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A packaged device, comprising:
a base having a first face and a second face;
a first chip of semiconductor material attached to the first face of the base and having main extension parallel to the base;
a second chip of semiconductor material carried by the base and having main extension transverse to the base;
a first package surrounding the first and second chips and covering the base, each chip having:
a first main surface and a second main surface;
an electronic circuit;
a transceiving circuit coupled to the electronic circuit;
an antenna and a magnetic coupling via, the antenna extending in proximity of the first main surface of the chip and being coupled to the transceiving circuit of the chip, and the magnetic via extending through the chip, between the antenna of the chip and the second main surface of the chip; and
a first magnetic coupling path coupled between a first one of the antenna and magnetic via of the first chip and a first one of the antenna and magnetic via of the second chip and a second magnetic coupling path coupled between a second one of the antenna and magnetic via of the first chip and a second one of the antenna and magnetic via of the second chip, the first magnetic coupling path including a parallel portion extending parallel to the first and second faces of the base, and the first and second magnetic coupling paths including respective transverse portions extending respectively on the main surfaces of the second chip in a direction transverse to the parallel portion.

2. The packaged device according to claim 1 wherein the transverse portions of the second magnetic coupling path forms a magnetic socket surrounding at least part of the second chip.

3. The packaged device according to claim 1 wherein the second chip is attached to the first main surface or to the second main surface of the first chip.

4. The packaged device according to claim 1 wherein the second magnetic coupling path includes a lower portion extending on the second face of the base, and includes connection portions extending laterally around the base.

5. The packaged device according to claim 1 wherein the second magnetic coupling path includes a lower portion extending on the second face of the base, and includes a magnetic via extending through the base.

6. The packaged device according to claim 1 wherein the second magnetic coupling path comprises a planar portion extending on the first face of the base.

7. The packaged device according to claim 1 wherein the base has a recess housing in part the second chip and the transverse portions of the first and second magnetic coupling paths.

8. The packaged device according to claim 1 wherein the first chip includes stacks of die having respective magnetic-coupling elements mutually stacked and coupled to the first and second of magnetic coupling paths.

9. The packaged device according to claim 1, comprising supporting walls extending laterally of at least the first and the second main surfaces of the second chip and extending substantially throughout a thickness of the first package.

10. The packaged device according to claim 2 wherein the magnetic socket is formed in the first package.

11. The packaged device according to claim 1 wherein the second chip partially extends from the first package and is removable.

12. The packaged device according to claim 11 wherein a second package extends on a side of the first package and covers the second chip that partially extends from the first package.

13. The packaged device according to claim 1, further comprising a third chip stacked to the first chip, the third chip includes a portion of a magnetic circuit that passes through the respective magnetic-coupling elements.

14. A packaged system, comprising:
a first base having a first surface and a second surface;
a first chip having a first surface and a second surface, the first chip including a first antenna positioned adjacent to the first surface of the first chip and a first magnetic via that extends from the first antenna to the second surface of the first chip, the first and second surfaces of the first chip being substantially parallel to the first surface of the first base;
a second chip having a first surface and a second surface, the second chip including a second antenna positioned adjacent to the first surface of the second chip and a second magnetic via that extends from the second antenna to the second surface of the second chip, the first and second surfaces of the second chip being substantially transverse to the first surface of the first base; and
a magnetic coupling coupled to the first antenna, the second antenna, the first magnetic via, and the second magnetic via.

15. The package system of claim 14 wherein the first chip and the second chip are in a first package.

16. The packaged system of claim 15, further comprising a second package that includes:
a second base having a first and a second surface;
a third chip having a first surface and a second surface, the third chip including a third antenna positioned adjacent to the first surface of the third chip and a third magnetic via that extends from the third antenna to the second surface of the third chip, the first and second surfaces of the third chip being substantially parallel to the first surface of the second base;
a first cavity sized and dimensioned to receive a portion of the second chip extending from the first package.

17. The packaged system of claim 16 wherein the second package is positioned on top of the first package, the first base being separated from the second base by the first chip, the second chip, and the third chip.

18. The packaged system of claim 16 wherein the second base include an opening sized and dimensioned to allow the second chip to be removed through the opening.

19. A method, comprising:
forming a packaged system including:
positioning a first chip having a first surface and a second surface on a first base, the first chip including a first antenna positioned adjacent to the first surface of the first chip and a first magnetic via that extends from the first antenna to the second surface of the first chip;
positioning the first and second surfaces of the first chip to be substantially parallel to a first surface of the first base;
positioning a second chip having a first surface and a second surface on the first base, the second chip including a second antenna positioned adjacent to the first surface of the second chip and a second magnetic via that extends from the second antenna to the second surface of the second chip;
positioning the first and second surfaces of the second chip to be substantially transverse to the first surface of the first base; and
forming a magnetic coupling that couples to the first antenna, the second antenna, the first magnetic via, and the second magnetic via.

20. The method of claim 19 wherein forming the packaged system includes:
enclosing the first chip and the second chip in a first package;
positioning a third chip having a first surface and a second surface on a second base, the third chip including a third antenna positioned adjacent to the first surface of the third chip and a third magnetic via that extends from the third antenna to the second surface of the third chip;
enclosing the third chip in a second package; and
attaching the first package to the second package.

21. The method of claim 20 wherein enclosing the third chip in the second package includes forming a first cavity sized and dimensioned to receive a portion of the second chip extending from the first package.

* * * * *